United States Patent
Eliassen

(10) Patent No.: US 11,300,630 B2
(45) Date of Patent: Apr. 12, 2022

(54) GROUND FAULT DETECTION

(71) Applicant: Siemens Energy AS, Oslo (NO)

(72) Inventor: Sivert Eliassen, Drammen (NO)

(73) Assignee: SIEMENS ENERGY AS, Oslo (NO)

( * ) Notice: Subject to any disclaimer, the term of this patent is extended or adjusted under 35 U.S.C. 154(b) by 0 days.

(21) Appl. No.: 16/968,578

(22) PCT Filed: Feb. 4, 2019

(86) PCT No.: PCT/EP2019/052627
§ 371 (c)(1),
(2) Date: Aug. 8, 2020

(87) PCT Pub. No.: WO2019/162071
PCT Pub. Date: Aug. 29, 2019

(65) Prior Publication Data
US 2021/0041507 A1 Feb. 11, 2021

(30) Foreign Application Priority Data
Feb. 23, 2018 (GB) ...................................... 1802923

(51) Int. Cl.
*G01R 31/396* (2019.01)
*G01R 31/392* (2019.01)
(Continued)

(52) U.S. Cl.
CPC ......... *G01R 31/396* (2019.01); *G01R 31/392* (2019.01); *G01R 31/52* (2020.01); *H02H 1/0007* (2013.01); *H02H 3/16* (2013.01)

(58) Field of Classification Search
None
See application file for complete search history.

(56) References Cited

U.S. PATENT DOCUMENTS

2001/0023703 A1* 9/2001 Kondo ............. H01L 31/02021
136/244
2007/0120536 A1 5/2007 Runkle et al.
(Continued)

FOREIGN PATENT DOCUMENTS

EP 2477040 A1 7/2012
EP 2741093 A1 6/2014
(Continued)

OTHER PUBLICATIONS

PCT International Search Report and Written Opinion of International Searching Authority dated Jul. 3, 2019 corresponding to PCT International Application No. PCT/EP2019/052627 filed Feb. 4, 2019.

*Primary Examiner* — Jas A Sanghera

(57) ABSTRACT

A method of ground fault detection in a power distribution system includes detecting a ground fault in the power distribution system; sending an instruction to a first switching device to disconnect a first energy storage unit from the energy storage system whilst the remaining energy storage units remain connected in parallel to the DC bus to be able to continue to supply power to the power distribution system and testing again for a ground fault. The testing for a ground fault is carried out again and disconnecting, testing and reconnecting steps are repeated until the ground fault has been identified, or all energy storage units have been tested.

11 Claims, 3 Drawing Sheets

(51) Int. Cl.
    *G01R 31/52*     (2020.01)
    *H02H 1/00*     (2006.01)
    *H02H 3/16*     (2006.01)

(56) References Cited

U.S. PATENT DOCUMENTS

| | | | |
|---|---|---|---|
| 2010/0085670 A1* | 4/2010 | Palaniswami | H01L 31/02021 361/42 |
| 2012/0163048 A1* | 6/2012 | Victor | H02H 3/16 363/55 |
| 2014/0097797 A1 | 4/2014 | Hendrix et al. | |
| 2014/0301000 A1 | 10/2014 | Takahashi et al. | |
| 2016/0261127 A1 | 9/2016 | Worry et al. | |

FOREIGN PATENT DOCUMENTS

| | | | |
|---|---|---|---|
| JP | 07325121 A | * | 12/1995 |
| JP | H07325121 A | | 12/1995 |

\* cited by examiner

GROUND FAULT DETECTION

CROSS REFERENCE TO RELATED APPLICATIONS

This application is the US National Stage of International Application No. PCT/EP2019/052627 filed 4 Feb. 2019, and claims the benefit thereof. The International Application claims the benefit of United Kingdom Application No. GB 1802923.1 filed 23 Feb. 2018. All of the applications are incorporated by reference herein in their entirety.

FIELD OF INVENTION

This invention relates to a ground fault detection system and method for energy storage modules, in particular for modules comprising an electrochemical cell, or battery, providing electrical energy to an end user.

BACKGROUND OF INVENTION

Stored electrical energy modules, or power units of various types are becoming increasingly common in many applications, in particular for use where there are environmental concerns relating to emissions in sensitive environments, or public health concerns. Stored electrical energy power units are typically used to provide electrical energy to operate equipment, to avoid emissions at the point of use, although that stored energy may have been generated in many different ways. Stored electrical energy may also be used to provide peak shaving in systems otherwise supplied from the grid, or from various types of power generation system, including diesel generators, gas turbines, or renewable energy sources. Aircraft, vehicles, vessels, offshore rigs, or rigs and other powered equipment in remote locations are examples of users of large scale stored electrical energy. Vehicle drivers may use the stored energy power unit in city centres and charge from an internal combustion engine on trunk roads, to reduce the harmful emissions in the towns and cities, or they may charge up from an electricity supply. Ferries which carry out most of their voyage relatively close to inhabited areas, or in sensitive environments are being designed with hybrid, or fully electric drive systems. Ferries may operate with stored energy to power the vessel when close to shore, using diesel generators offshore to recharge the batteries. In some countries the availability of electricity from renewable energy sources to use to charge the stored energy unit means that a fully electric vessel may be used, provided that the stored energy units are sufficiently reliable for the distances being covered, with no diesel, or other non-renewable energy source used at all. Whether hybrid, or fully electric, the stored energy units may be charged from a shore supply when docked. The development of technology to achieve stored energy units that are reliable enough for prolonged use as the primary power source must address certain technical issues.

SUMMARY OF INVENTION

In accordance with a first aspect of the present invention, a method of ground fault detection in a power distribution system comprising an energy storage system; a system controller; and a ground fault detection system, wherein the energy storage system comprises a plurality of energy storage units, each of the plurality of energy storage units being connected together in parallel to a DC bus of the power distribution system; each energy storage unit comprising a plurality of energy storage modules connected together in series; the method comprising detecting a ground fault in the power distribution system; sending an instruction to a first switching device to disconnect a first energy storage unit from the energy storage system whilst the remaining energy storage units remain connected in parallel to the DC bus to be able to continue to supply power to the power distribution system; testing again for a ground fault; if the ground fault is no longer present, providing an indication that the ground fault is in the first energy storage unit; if the ground fault is still present, sending an instruction from the controller to reconnect the first energy storage unit; sending an instruction from the controller to disconnect a next energy storage unit; testing again for a ground fault; and repeating the disconnecting, testing and reconnecting steps until the ground fault has been identified, or all energy storage units have been tested.

If the ground fault persists after all energy storage units have been tests, an indication may be provided that the ground fault is in a part of the power distribution system, other than the energy storage system.

When a cabinet with a fault has been identified, the system may continue to run without that cabinet in some cases the fault may be in the cabinet, rather than in the modules of the cabinet—or an operator may replace all battery modules within the cabinet, without searching for the exact location of the fault, but advantageously the method further comprises connecting a removable ground fault detection unit to the disconnected energy storage unit in which a ground fault has been identified and carrying out a process to identify a faulty energy storage module within the energy storage unit.

The process may comprise isolating a first module at both terminals; checking for a ground fault in the remaining modules; if no ground fault is present, removing and replacing the isolated module; if a ground fault is still present; reconnecting the isolated module; isolating a next module; checking again for a ground fault in the cabinet; if the ground fault is still present, repeating the isolating and checking steps until the faulty module is determined.

The method may further comprise, after removing and replacing the faulty module and determining that no further faulty modules are present, reconnecting the cabinet to the energy storage system.

The isolating, checking and reconnecting steps may be carried out automatically under control of a local cabinet controller, by sending a control signal to a module switching device to isolate the module, to test for a ground fault in the remaining modules, and to reconnect the module, if no ground fault is discovered.

In accordance with a second aspect of the present invention, a power distribution system comprises an energy storage system; a system controller; and a ground fault detection system; wherein the energy storage system comprises a plurality of energy storage units, each of the plurality of energy storage units being connected together in parallel to a DC bus of the power distribution system; each energy storage unit comprising a plurality of energy storage modules connected together in series; wherein the ground fault detection system comprises a ground fault detection module; and a control module; wherein each energy storage unit comprises a switching device to connect or disconnect each energy storage unit from the DC bus under the control of the control module whilst the remaining energy storage units remain connected in parallel to the DC bus to be able to continue to supply power to the power distribution system.

There may be one energy storage device in a cabinet, or there may be a plurality of energy storage devices in a cabinet. For a plurality of energy storage devices, they be connected in parallel or in a combination of series and parallel, but advantageously each energy storage module comprises a plurality of energy storage devices connected together in series.

The energy storage devices may comprise one of an electrochemical cell, or battery.

The power distribution system may be an isolated power system able to continue to operate with a ground fault condition.

BRIEF DESCRIPTION OF THE DRAWINGS

An example of a ground fault detection system and method for energy storage modules in a power distribution system, according to the present invention will now be described with reference to the accompany drawings in which.

DETAILED DESCRIPTION OF INVENTION

Early large scale batteries were lead acid, but more recently, lithium ion batteries have been developed for electrical energy storage for large scale applications. Li-ion batteries are typically pressurised and the electrolyte is flammable, so they require care in use and storage. A problem which may occur with Li-ion batteries is thermal runaway which may be caused by an internal short circuit in a battery cell, created during manufacture. Other causes, such as mechanical damage, overcharge, or uncontrolled current may also cause thermal runaway, but the battery system design is typically adapted to avoid these. Manufacturing issues with the cells cannot be ruled out entirely, so precautions are required to minimise the effect should thermal runaway occur. In a large scale Li-ion battery system, the amount of energy that is released during a thermal runaway is a challenge to contain. A thermal event may increase temperatures in a single cell from a standard operating temperature in the range of 20° C. to 26° C. to as much as 700° C. to 1000° C. Safe operating temperatures are below 60° C., so this is a significant problem.

There are strict regulations in the marine and offshore industries regarding risk to the vessel or rig, one requirement being that there should be no transfer of excess temperature from one cell to another. If overheating occurs, then it should be contained in a single cell and not allowed to spread. In addition, for marine and offshore applications, weight and volume of any equipment is severely restricted, leading to compact, lightweight systems being advantageous. It is a challenge to produce a compact, lightweight, system that achieves the required thermal isolation and cools the cell in which excess heating occurs, quickly and efficiently.

In a Li-ion battery system, it is very important that the temperature of the battery cells does not exceed the prescribed operating temperature and that the cell temperature in the entire system is uniform. Sustained operation outside the prescribed operating temperature window may severely affect the lifetime of the battery cells and increases the risk of thermal runaway occurring.

For marine applications, there is a particular focus on using energy storage modules, such as batteries, at their maximum charge or discharge rate due to cost of installation and the weight and space taken up by the modules when on a vessel or offshore platform. Furthermore, maintenance and repair, or replacement is complicated and expensive compared to land-based uses of stored energy systems, so extending the lifespan of stored energy modules is particularly important. For the example of Li-ion batteries, these are sensitive to high temperature, so it is important to ensure that the operating and ambient temperature are controlled for all cells of a Li-ion battery system to ensure the design lifetime is met. Local variations or hot spots on a single cell may also compromise the total lifetime achievable.

Figure 1:
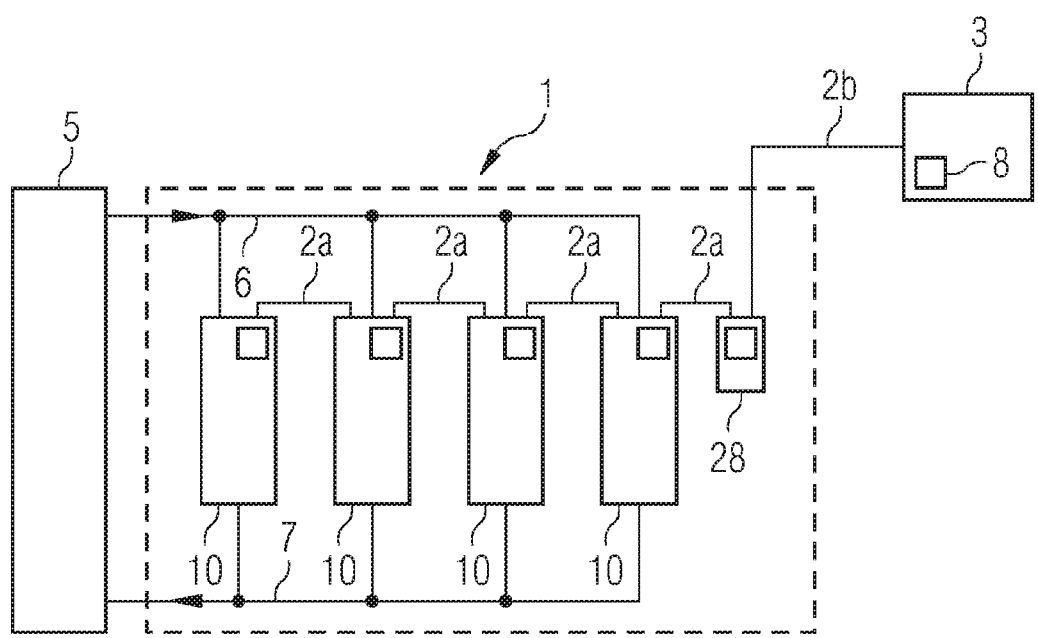
FIG. 1 is a block diagram illustrating an example of a modular stored energy system, in which the present invention may be applied.

An example of an energy storage system in which the present invention may be applied is illustrated in FIG. 1. The system comprises an energy storage unit, for example a cabinet, or cubicle 1, in which a plurality of energy storage modules 10 are electrically connected together in series by buses 2a to a cubicle controller 28 and by bus 2b to a central controller 3. Typically, a module comprises sufficient battery cells at approximately 3V electrically connected in series to form a battery module at, at least 78 V, in some cases up to 120V. The battery modules are electrically connected in series within a single cabinet or cubicle at approximately 1 kV. For the overall system, there are then multiple cubicles in parallel in the battery room.

Each of the energy storage modules is cooled by cooling fluid, circulating from cooling system 5 through inlet pipes 6 and outlet pipes 7. The cooling systems may be fluidly connected in either series or parallel. Connection in parallel simplifies supplying the cooling fluid at the same temperature to each module. The cooling fluid is typically water which is inexpensive and easier to source and dispose of than synthetic coolants. Each energy storage module 10 comprises a plurality of energy storage devices, for example battery cells, electrically connected together in series. A modular system of this type, incorporating cooling, is particularly applicable for Li-ion cells.

Within a module 10, on one side of each cell, a battery cell cooler is provided through which cooling fluid from the cooling system 5 passes via the inlet pipes 6 and outlet pipes 7 to cool the battery cell. The cell cooler comprises tubing for the cooling fluid to flow through, which may be metal tubing, but more typically is a synthetic material, such as polymer plastics, for example polythene, polyamide, such as PA66 plastics, or thermoplastics such as TCE2, TCE5, or other suitable materials, which may be moulded or extruded to the required shape and is able to withstand normal operating temperatures of the energy storage modules 10.

US20160336623 describes a monitoring and regulating system for energy storage devices which includes a battery management system that is able to open relays or contactors if a measured current exceeds a predetermined threshold, when charging, discharging or idling and may also include monitoring for ground fault or leakage current conditions in cells.

A ground fault in an electric system is undesirable and may give rise to safety issues, so the ground fault needs to be cleared as soon as practically possible. There are a number of standardised earthing systems which may be used in power distribution networks. A TT system is one where there is a direct connection of a point with earth for the power supply equipment and a local direct connection with earth for the consumer; a TN system is one in which the power source is earthed and all exposed conductive parts are connected to the neutral conductor; and an IT system is one in which there is no connection to earth, it is isolated, or there is a high impedance earth connection.

For a grounded power system, such as a TN-system, a ground fault leads to a fault current, which may be substantial, that the system must be designed to clear by means of a fuse, or circuit breaker, or equivalent. However, an isolated power system, an IT-system, is generally able to continue operation with a ground fault condition, although it is desirable to clear the ground fault as soon as possible by disconnecting the faulty equipment from the power system. If the fault is not cleared promptly, then maintaining operation with a ground fault condition in the IT system gives rise to elevated voltages to earth that may cause damage to equipment, or pose a threat to personnel. The uncleared ground fault may also leave the IT system more vulnerable to a second ground fault. The second ground fault in this case, typically causes fault currents similar to the first ground fault in a TN-system.

For critical operations, such as for marine and offshore power systems, for example for position keeping on a drilling vessel, or onshore, for example, hospital equipment, it is often considered better to maintain operation with a ground fault than to risk disconnecting essential equipment. For marine & offshore power systems, a ground fault usually causes opening of a bus-tie, isolating the two power systems onboard so that only half the power system is shut down if a 2nd ground fault should occur. This is not an ideal situation, and if possible, the faulty equipment should still be disconnected.

In order to clear a ground fault, a means of disconnecting the faulty equipment is required, typically a circuit breaker, and the location of the ground fault must be known, so that the correct equipment is disconnected. Ground fault detection systems for isolated systems may be used to detect a ground fault, and current transformers connected to the detection system may provide an indication of which part of the system the fault has occurred in. Energy storage systems may comprise several battery units connected in parallel, and if a ground fault occurs in one of these, a high number of current transformers would be required for a precise localization.

Often, ground fault detection is only provided on a system level, giving an indication that a ground fault has occurred, but without any indication in which part of the system it is located. This requires extensive manual troubleshooting, which is time consuming and in most cases requires working on an energized system. Once the ground fault has been located, the relevant part of the system can be disconnected. If ground fault detection is to be carried out more accurately, the conventional methods would require a current transformer for every branch. In the event of a ground fault in an energy storage system, it is desirable to be able to localise the fault in a more efficient manner, in order to determine which cabinet has the fault and subsequently all a module within the cabinet to be replaced, without the use of large numbers of current transformers to obtain the more detailed information. Although current transformers could be located on each cabinet to give a more precise location for a ground fault and isolate it, this is still bulky and costly, whereas the design of the present disclosure overcomes these problems.

Figure 2:
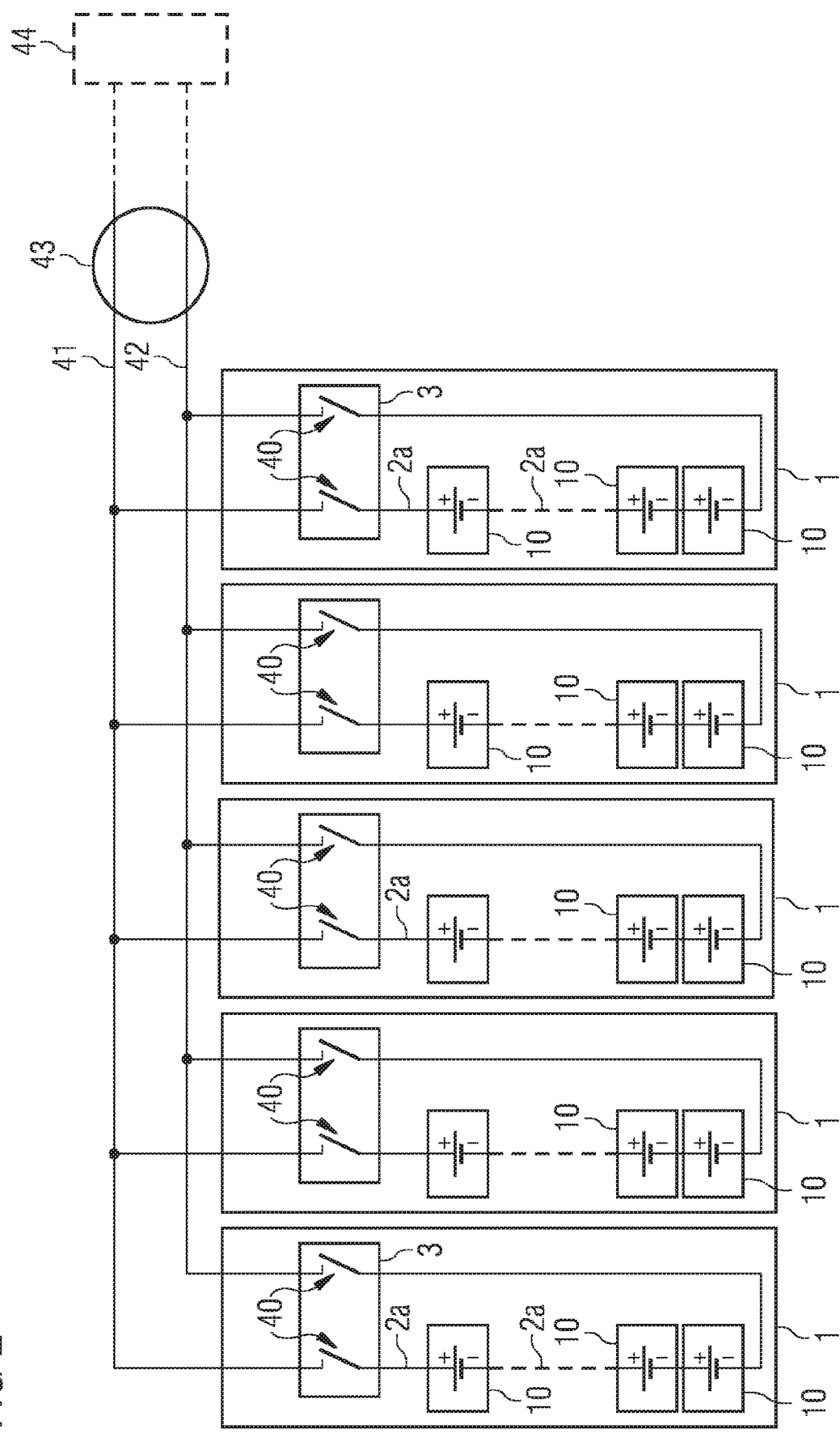
FIG. 2 is a block diagrams illustrating the present invention.
Figure 3:
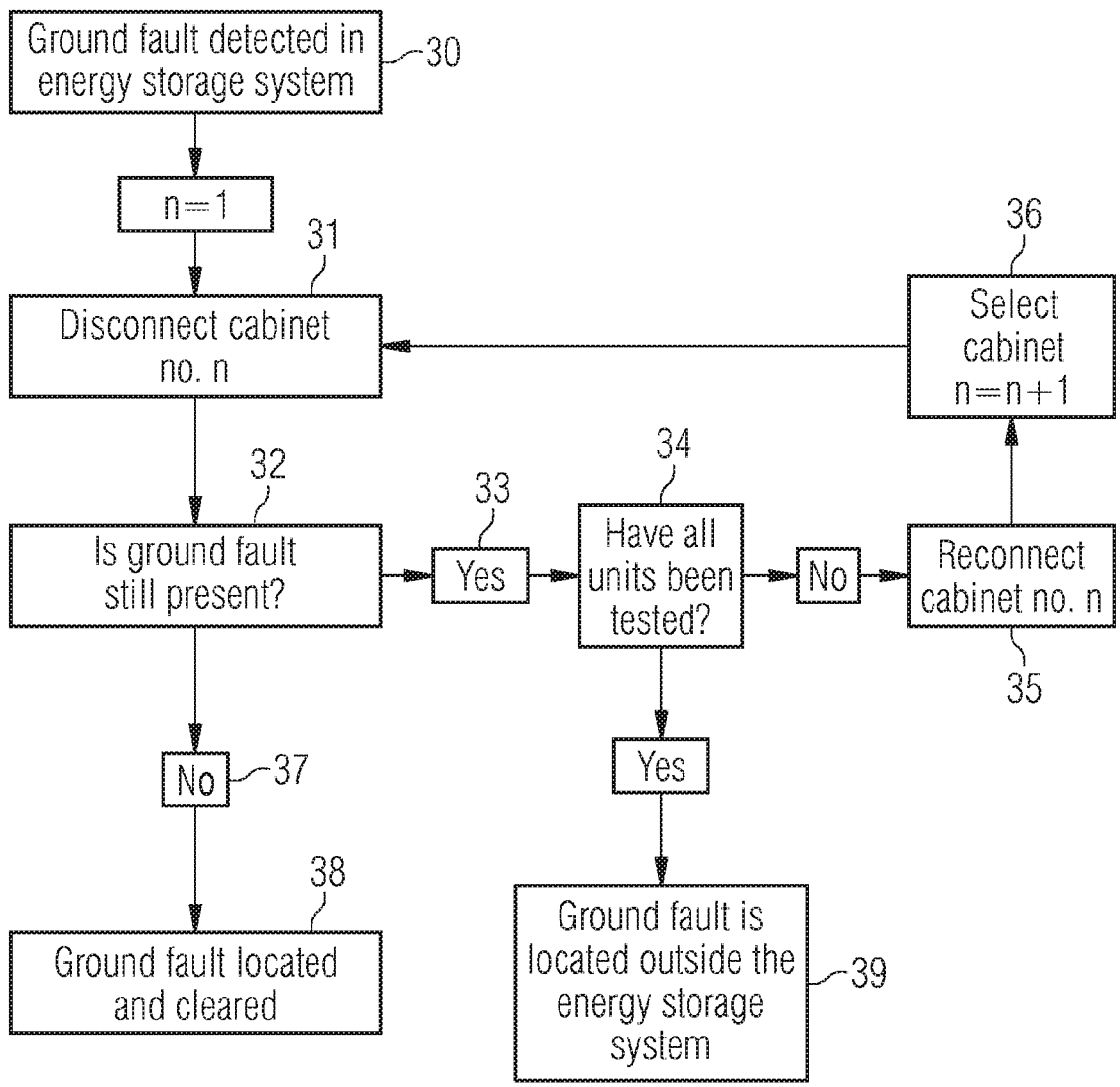
FIG. 3 is a flow diagram illustrating a method according to the present invention.

The invention makes use of built-in features of a typical energy storage system to locate and clear the fault efficiently, without the need for many current transformers for ground fault location. At a coarser level, this may also be carried out without manual troubleshooting. FIGS. 2 and 3 illustrate the system of the present invention and the process involved in dealing with ground faults, using the method of the present invention. Multiple cabinets 1 are connected in parallel by DC buses 41, 42. A current transformer 43 is provided for both phases. Within each cabinet is a controller 3 including a switching device, such as circuit breaker 40, which may be activated on receipt of a control instruction, via a control signal from the central controller 44. There is no power flow from the central controller. Both phases are disconnected and the battery string is completely galvanically isolated from the rest of the system. The controller is able to open or close the circuit breakers in each cabinet one at a time to disconnect that cabinet. Meanwhile all other cabinets are still connected to the system and able to supply energy.

When a ground fault is detected 30 in the energy storage system, each of the cabinets 1, containing energy storage modules 10, may be disconnected, one at a time using the switching device 40 located in the cabinet. The process may be automated by using programmable logic controller (PLC) circuit breakers, or other suitable means of providing galvanic isolation. The breakers may be selected and disconnected under the control of a central system controller. Starting from the first of n cabinets 1, cabinet n=1 is disconnected 31 by opening the circuit breaker for that cabinet, in response to an instruction to disconnect that cabinet. A test 32 is made to see whether or not the ground fault is still present. If the ground fault is still present 33 after that cabinet 1 has been disconnected, then that cabinet is reconnected 34 by closing the circuit breaker, in response to an instruction from the controller. The next cabinet, n=n+1, is selected 35 and then disconnected 31 in the same way. This process is repeated until the effect of disconnecting a specific cabinet 1 is that the ground fault detector indicates 36 that there is no longer a ground fault present. The ground fault detector may be provided by the current transformer 43 of FIG. 2 together with a data processing unit, typically part of the system controller 44. The indication that the ground fault is no longer present means that the ground fault has been successfully located 37 and the specific cabinet whose disconnection caused the ground fault to be removed is left disconnected.

The method is applicable for localizing a single ground fault, so is not suitable for a TN-system, which has a "ground fault" by design. If there are two ground faults in the system, for example, the first actual ground fault in a TN system or a first and a second ground fault in a IT-system, large fault currents will flow, of the same order of magnitude as a short circuit, so then one of the circuit breakers in the system operates due to this high current in order to stop the large fault current from flowing. Clearing the first ground fault as soon as possible avoids getting to this stage. When this circuit breaker has operated, it has in practice isolated one of the ground faults, so the method of the present invention can be applied to localize and clear the $2^{nd}$ ground fault.

An operator may then be directed to the faulty energy storage unit to test for faults within the cabinet. Once the faulty cabinet has been identified, the fault may be narrowed down to a module level. This relies on disconnecting a module, so requires individual modules to be able to be isolated. For example, each module may be provided with a circuit breaker within the module, isolating the module at both terminals. This circuit breaker may also be remotely operated. The process may be carried out by an operator using a removable, or hand-held, earth fault detection system on that specific cabinet, in a similar manner to the process of FIG. 3, but within the cabinet with the earth fault, isolating one module at a time until the fault disappears. The faulty energy storage module may then be disconnected, extracted from the cabinet and replaced and the cabinet reconnected to the energy storage system. In practice, the cost of having circuit breakers in each module and the relatively low number of modules in a cabinet or string means manually disconnecting one module at a time by removing the power cables connected to it etc., may be advantageous.

The method of the present invention may be implemented without requiring additional hardware, enabling automatic localization of a ground fault in an energy storage system without the need for current transformers on each battery pack. A circuit breaker controlled via a programmable logic controller or other similar device installed in each cabinet may be easily integrated into an energy storage system. The method allows a quick check to be made of whether the fault lies in the energy storage system, when a ground fault has been detected on a power distribution system level and if the check clears the fault, if it is located in the battery system, or indicates that there is no fault present there, then manual troubleshooting of other parts of the power distribution system may be carried out thereafter. Power distribution system includes all parts of the power system that is galvanically connected to the energy storage unit. Part of a power circuit may be separated from another part of the power circuit by the use of a transformer, so all parts of the same power system as the energy storage unit that do not have a transformer in between are included in the power distribution system.

The method of the present invention is particularly suitable for energy storage systems, as compared with other parts of power systems, because in battery systems there are multiple power sources, or loads, i.e. the cabinets shown in FIG. 2, electrically connected together in parallel. Each cabinet individually is not critical to the system and thus can be disconnected temporarily without any loss of functionality, compared to disconnecting i.e. a motor operating a specific load that should not be interrupted. The time for which each cabinet is disconnected is typically in the range of 5 to 20 seconds, an interval in which the other cabinets may increase or decrease their state of charge compared to the disconnected cabinet. However, this interval is sufficiently short that there is a very limited difference in state of charge between the reconnected battery pack and the other packs, meaning this can be done safely.

An energy storage system is able to handle operation with a temporary reduction of maximum power, associated with disconnecting one cabinet containing battery modules, for the example illustrated in FIG. 2 four out of five cabinets remain connected throughout the test process. Disconnecting a battery pack only represents a temporary reduction in power, but the energy available is not reduced for long, as a healthy battery pack can be reconnected after short time, once the faulty one has been identified.

A lot of manual troubleshooting is avoided by setting up the system to automatically carry out troubleshooting to determine which cabinet is faulty, in the event that a ground fault is detected in the energy storage system. This reduces the servicing costs, as the man hours required for troubleshooting may be limited to the time spent identifying and replacing one or more modules in a cabinet, which the system has identified as being faulty, rather than having to work through each cabinet before that step can begin. Reducing the use of personnel in the troubleshooting, reduces the risk of injury during troubleshooting on a faulty power system The method enables a significant reduction in the time that the system must continue to operate with a ground fault, so minimizing the risk of a second, and critical, ground fault occurring. There is no need for current transformers in each cabinet for precise location of the fault, reducing assembly time, cost and space requirements.

Although the detailed examples have been given with respect to electrochemical cells, such as batteries, for example Li-ion, alkaline, or NiMh batteries, or others, the invention applies to other types of stored energy units, in particular non-cylindrical capacitors, ultracapacitors, or supercapacitors, fuel cells, or other types of energy storage.

The invention claimed is:

1. A method of ground fault detection in a power distribution system comprising an energy storage system; a system controller; and a ground fault detection system, the energy storage system comprising a plurality of energy storage units, each of the plurality of energy storage units being connected together in parallel to a DC bus of the power distribution system; each energy storage unit comprising a plurality of energy storage modules connected together in series; the method comprising:
   detecting a ground fault in the power distribution system;
   sequentially disconnecting each energy storage unit from the energy storage system whilst the remaining energy storage units remain connected in parallel to the DC bus to be able to continue to supply power to the power distribution system to identify the energy storage unit that contains the ground fault; and
   disconnecting the identified energy storage unit.

2. The method according to claim 1,
   wherein when the ground fault persists after all energy storage units have been tested, providing an indication that the ground fault is in a part of the power distribution system, other than the energy storage system.

3. The method of claim 1, further comprising carrying out a process to identify a faulty energy storage module within the disconnected energy storage unit, the process to identify the faulty energy storage module comprising:
   sequentially isolating each energy storage module at both terminals;
   checking for a ground fault in the remaining non-isolated energy storage modules; and
   removing and replacing the isolated energy storage module in response to no ground fault being detected.

4. The method of claim 3, wherein after the step of disconnecting the identified energy storage unit, the method further comprises connecting a removeable ground fault detection unit to the disconnected energy storage unit.

5. A method of ground fault detection in a power distribution system comprising an energy storage system; a system controller; and a ground fault detection system, the energy storage system comprising a plurality of energy storage units, each of the plurality of energy storage units being connected together in parallel to a DC bus of the power distribution system; each energy storage unit comprising a plurality of energy storage modules connected together in series; the method comprising:
   detecting a ground fault in the power distribution system;
   sending an instruction to a first switching device to disconnect a first energy storage unit from the energy storage system whilst the remaining energy storage units remain connected in parallel to the DC bus to be able to continue to supply power to the power distribution system;
   testing again for a ground fault;
   when the ground fault is no longer present, providing an indication that the ground fault is in the first energy storage unit;

when the ground fault is still present, sending an instruction from the controller to reconnect the first energy storage unit;
sending an instruction from the controller to disconnect a next energy storage unit; testing again for a ground fault;
repeating the disconnecting, testing and reconnecting steps until the ground fault has been identified, or all energy storage units have been tested;
connecting a removable ground fault detection unit to the disconnected energy storage unit in which a ground fault has been identified and carrying out a process to identify a faulty energy storage module within the energy storage unit;
isolating a first module at both terminals;
checking for a ground fault in the remaining modules;
when no ground fault is present, removing and replacing the isolated module;
when a ground fault is still present; reconnecting the isolated module; isolating a next module; checking again for a ground fault in the energy storage unit; and
when the ground fault is still present, repeating the isolating and checking steps until the faulty module is determined.

6. The method according to claim 5, further comprising:
after removing and replacing the faulty module and determining that no further faulty modules are present, reconnecting the energy storage unit to the energy storage system.

7. The method according to claim 5,
wherein the isolating, checking and reconnecting steps are carried out automatically under control of a local cabinet controller, by sending a control signal to a module switching device to isolate the module, to test for a ground fault in the remaining modules, and to reconnect the module, when no ground fault is discovered.

8. A power distribution system, the power distribution system comprising:
an energy storage system;
a system controller; and
a ground fault detection system;
wherein the energy storage system comprises a plurality of energy storage units, each of the plurality of energy storage units being connected together in parallel to a DC bus of the power distribution system; each energy storage unit comprising a plurality of energy storage modules connected together in series;
wherein the ground fault detection system comprises a ground fault detection module; and a control module;
wherein each energy storage unit comprises a switching device to connect or disconnect an energy storage unit from the DC bus under the control of the control module whilst the remaining energy storage units remain connected in parallel to the DC bus to be able to continue to supply power to the power distribution system; and
a removable ground fault detection unit operable to selectively connect to each of the energy storage modules sequentially to identify a ground fault in one of the energy storage modules.

9. The power distribution system according to claim 8,
wherein each energy storage module comprises a plurality of energy storage devices connected together in series.

10. The power distribution system according to claim 9,
wherein the energy storage devices comprise one of an electrochemical cell, or battery.

11. The power distribution system according to claim 8,
wherein the power distribution system is an isolated power system able to continue to operate with a ground fault condition.

* * * * *